United States Patent
Moreland et al.

(10) Patent No.: US 6,680,617 B2
(45) Date of Patent: Jan. 20, 2004

(54) APERTURED PROBES FOR LOCALIZED MEASUREMENTS OF A MATERIAL'S COMPLEX PERMITTIVITY AND FABRICATION METHOD

(75) Inventors: Robert L. Moreland, Lothian, MD (US); Hans M. Christen, Knoxville, TN (US); Vladimir V. Talanov, Greenbelt, MD (US); Andrew R. Schwartz, Bethesda, MD (US)

(73) Assignee: Neocera, Inc., Beltsville, MD (US)

( * ) Notice: Subject to any disclaimer, the term of this patent is extended or adjusted under 35 U.S.C. 154(b) by 0 days.

(21) Appl. No.: 10/266,611

(22) Filed: Oct. 9, 2002

(65) Prior Publication Data

US 2003/0030449 A1 Feb. 13, 2003

Related U.S. Application Data

(63) Continuation-in-part of application No. 09/665,370, filed on Sep. 20, 2000, now Pat. No. 6,597,185.

(51) Int. Cl.[7] .......................... G01R 27/04; G01R 27/26
(52) U.S. Cl. .................. 324/638; 324/690; 324/754
(58) Field of Search .............................. 324/638, 754, 324/752, 753, 758, 690, 636; 29/846; 438/674; 250/234, 578.1

(56) References Cited

U.S. PATENT DOCUMENTS

| | | | | |
|---|---|---|---|---|
| 5,168,538 A | * | 12/1992 | Gillespie | 385/123 |
| 5,502,392 A | * | 3/1996 | Arjavalingam et al. | 324/638 |
| 5,508,627 A | * | 4/1996 | Patterson | 324/752 |
| 5,543,386 A | * | 8/1996 | Findikoglu et al. | 505/210 |
| 5,821,410 A | * | 10/1998 | Xiang et al. | 73/105 |
| 5,900,618 A | | 5/1999 | Anlage et al. | 250/201.3 |
| 5,936,237 A | * | 8/1999 | van der Weide | 250/234 |
| 6,173,604 B1 | * | 1/2001 | Xiang et al. | 73/105 |
| 6,285,811 B1 | | 9/2001 | Aggarwal et al. | 385/31 |
| 2002/0153909 A1 | * | 10/2002 | Petersen et al. | 324/754 |

OTHER PUBLICATIONS

William R. Smythe, "Static and Dynamic Electricity," Third Edition, pp. 128–227.

M. Fee et al., "Scanning Electromagnetic Transmission Line Microscope with Sub–Wavelength Resolution," Optics Communications, vol. 69, No. 3.4, Jan. 1, 1989, pp. 219–224.

James Baker–Jarvis et al., "Analysis of an Open–Ended Coaxial Probe with Lift–Off for Nondestructive testing," IEEE Transactions on Instrumentation and Measurement, vol. 43, No. 5, Oct. 1994, pp. 711–717.

D. E. Steinhauer et al., "Surface Resistance Imaging With a Scanning Near–Field Microwave Microscope," Applied Physics Letters, vol. 71, No. 12, Sep. 22, 1997, pp. 1736–1738.

Saeed Pilevar et al., "Focused Ion–Beam Fabrication of Fiber Probes with Well–Defined Aperatures for Use in Near–Field Scanning Optical Microscopy," Applied Physics Letters, vol. 72, No. 24, Jun. 15, 1998, pp. 3133–3135.

Paul J. Petersan et al., "Measurement of Resonant Frequency and Quality Factor of Microwave Resonators: Comparison of Methods," Journal of Applied Physics, vol. 84, No. 6, Sep. 15, 1998, pp. 3392–3402.

(List continued on next page.)

Primary Examiner—Anjan K. Deb
(74) Attorney, Agent, or Firm—Rosenberg, Klein & Lee

(57) ABSTRACT

A probe for non-destructive determination of complex permittivity of a material and for near field optical microscopy is based on a balanced multi-conductor transmission line structure created on a dielectric substrate member which confines the probing field within a sharply defined sampling volume in the material under study.

19 Claims, 8 Drawing Sheets

OTHER PUBLICATIONS

C. Gao et al., "Quantitative Microwave Near–Field Microscopy of Dielectric Properties," Review of Scientific Instruments, vol. 69, No. 11, Nov. 1998, pp. 3846–3851.

Fred Duewer et al., "Tip–Sample Distance Feedback Control in a Scanning Evanescent Microwave Microscope," Applied Physics Letters, vol. 74, No. 18, May 3, 1999, pp. 2696–2698.

M. Tabib–Azar et al., Nondestructive Superresolution Imaging of Defects and Nonuniformities in Metals. Semiconductors, Dielectrics, Composites, and Plants Using Evanescent Microwaves, Review of Scientific Instruments, vol. 70, No. 6, Jun. 1999, pp. 2783–2792.

Rimma Dekhter et al., "Investigating Material and Functional Properties of Static Random Access Memories Using Cantilevered Glass Multiple–Wire Force–Sensing Thermal Probes," Applied Physics Letters, vol. 77, No. 26, Dec. 25, 2000, pp. 4425–4427.

* cited by examiner

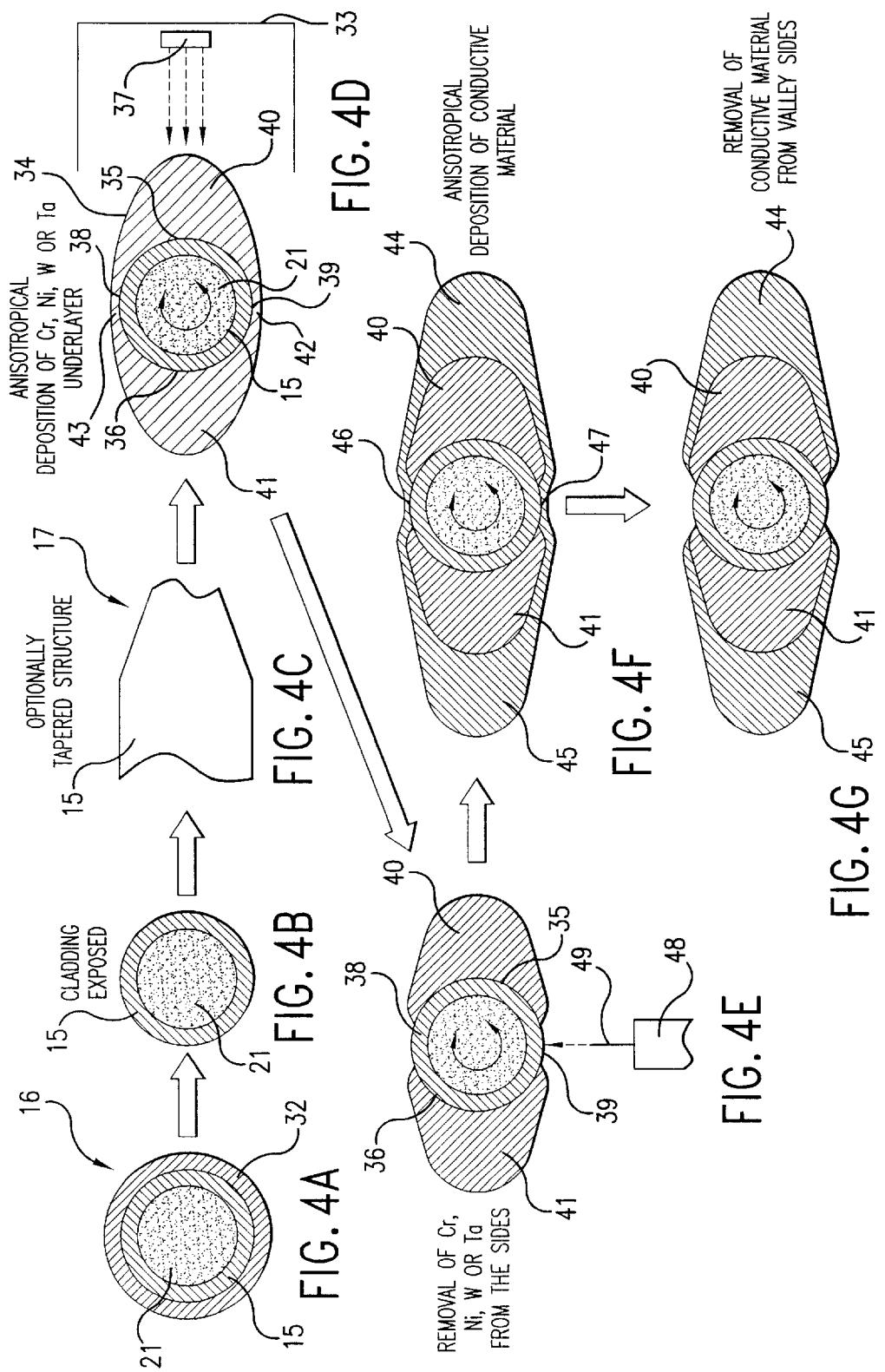

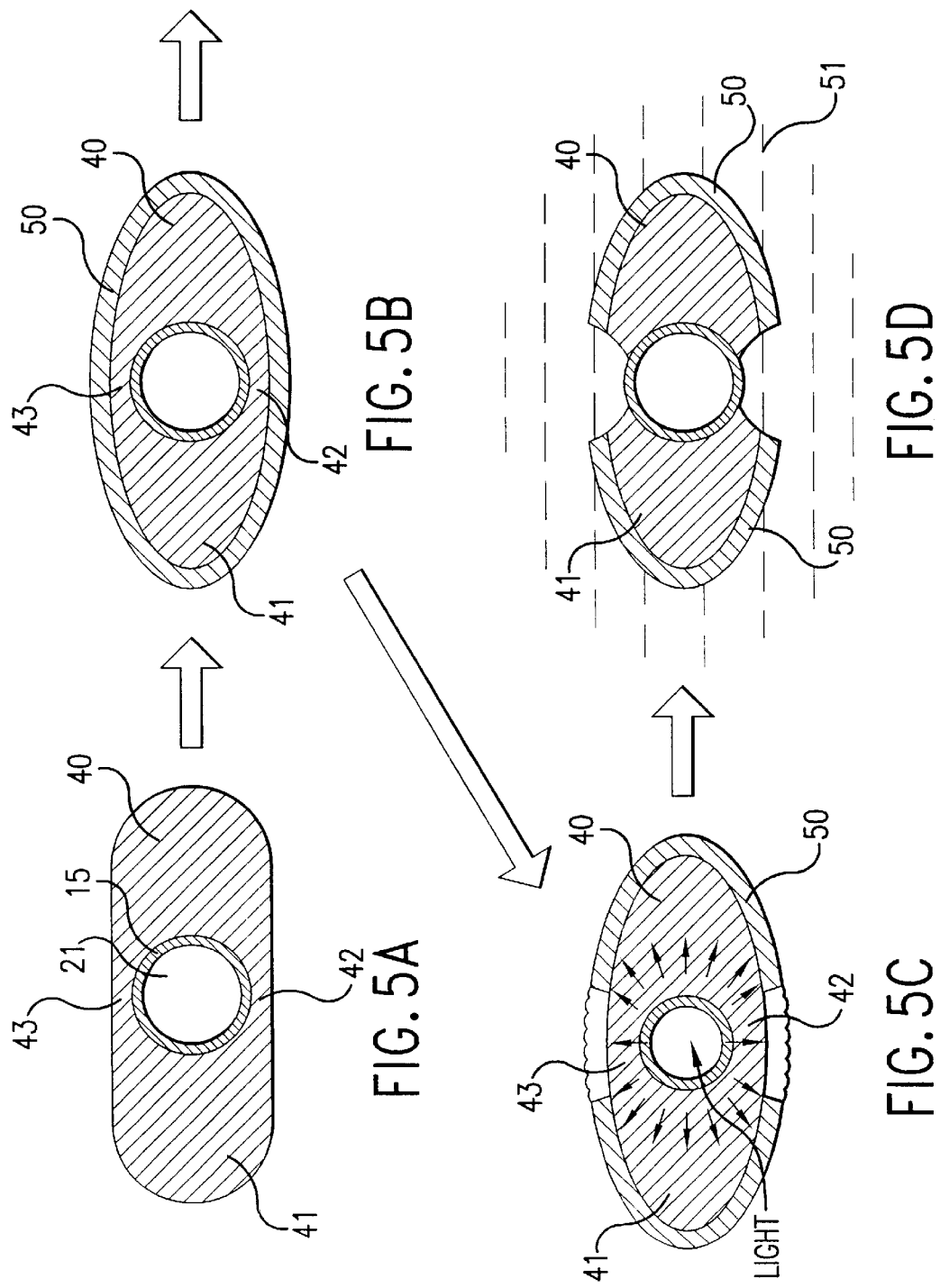

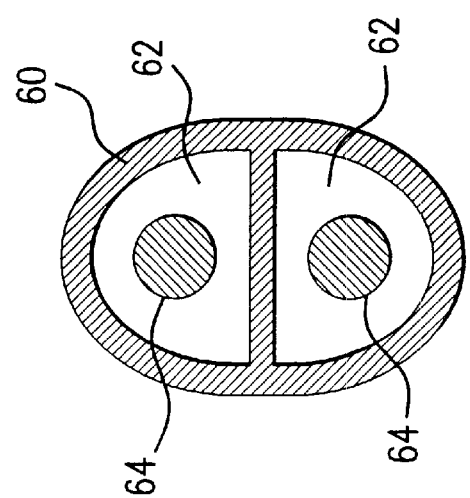
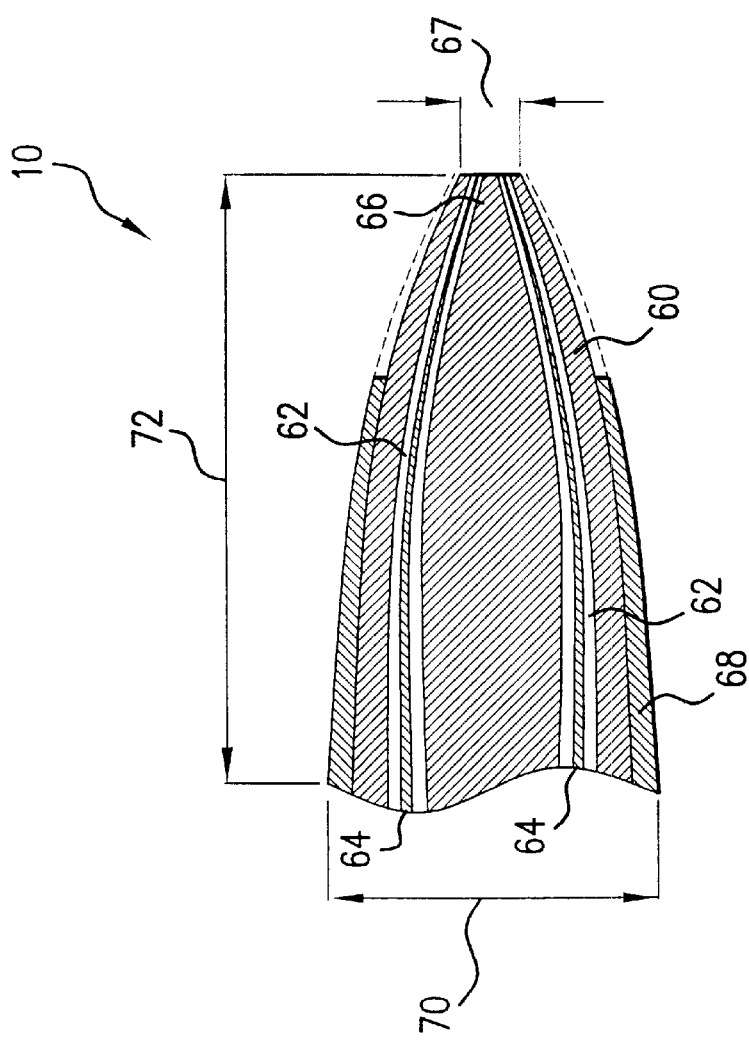

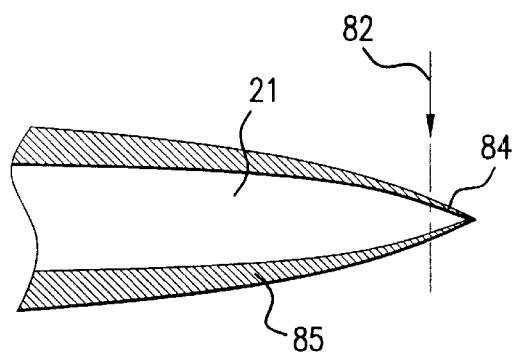
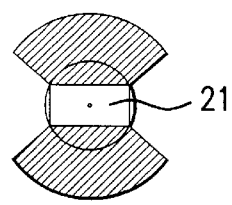
FIG. 7A  FIG. 7B
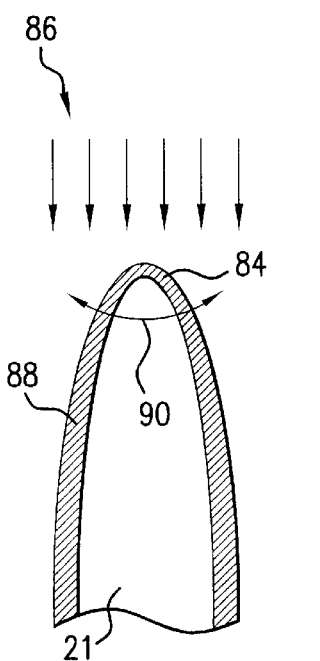
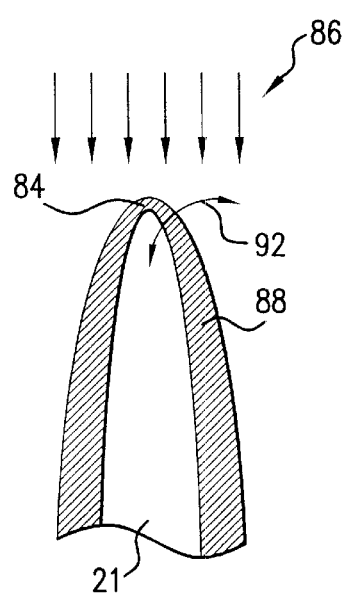
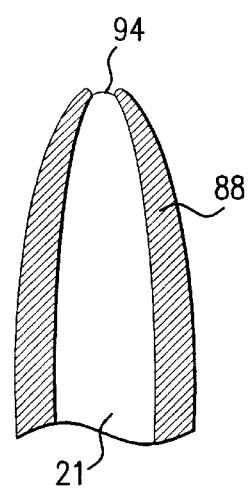
FIG. 8A  FIG. 8B  FIG. 8C

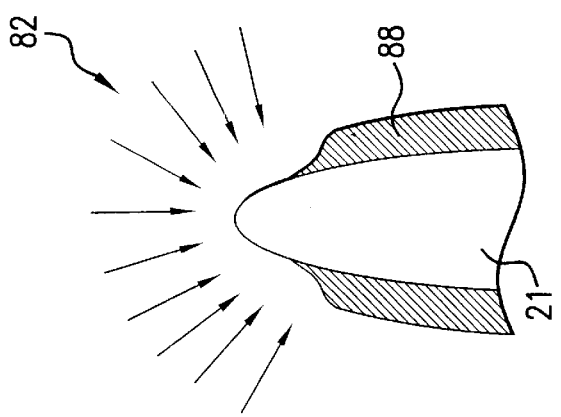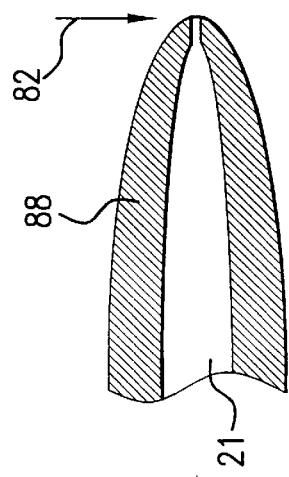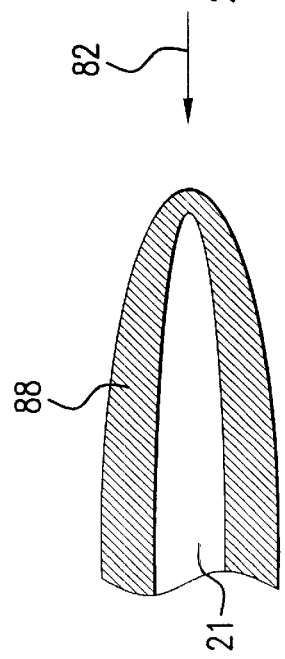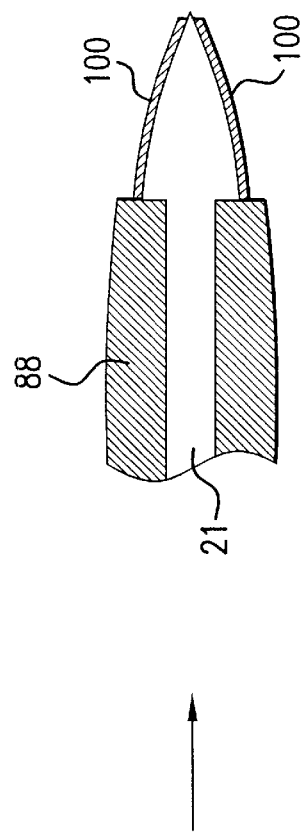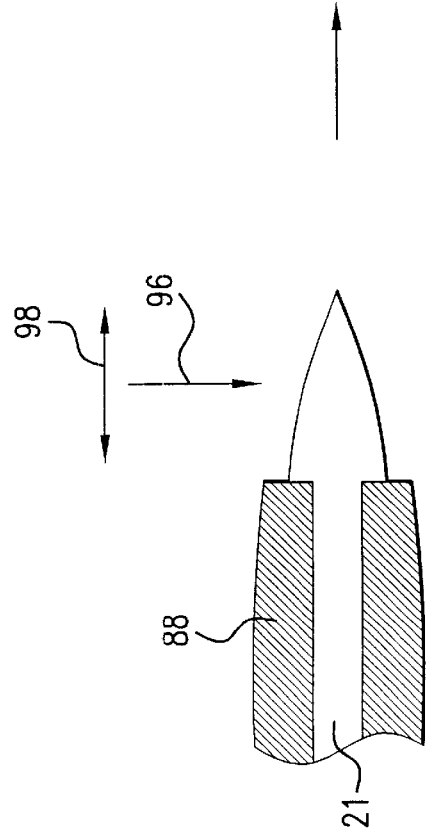

APERTURED PROBES FOR LOCALIZED MEASUREMENTS OF A MATERIAL'S COMPLEX PERMITTIVITY AND FABRICATION METHOD

This Patent Application is a Continuation-in-Part of a patent application Ser. No. 09/665,370, filed on Sep. 20, 2000 "Apparatus for Localized Measurement of Complex Permittivity of a Material", now U.S. Pat. No. 6,597,185 B1.

FIELD OF THE INVENTION

The present invention relates to measurement techniques. In particular this invention directs itself to a technique for highly localized measurements of complex microwave permittivity of materials and for near-field optical microscopy.

More in particular, the present invention relates to a probe for nondestructive determination of complex permittivity of a material based on a balanced mufti-conductor transmission line resonator which provides confinement of a probing field within a sharply defined sampling volume of the material under study to yield a localized determination of the material's complex permittivity.

Furthermore, the present invention relates to fabrication of elongated dielectric support member based probes for localized measurements of complex permittivity of materials at frequencies from about 10 MHz to 100 GHz, where the fabrication process involves coating of an elongated dielectric support member with conducting material which is then processed to remove the conducting material from predetermined sides of the dielectric to yield a dielectric support member coated with a multi-conductor transmission line.

BACKGROUND OF THE INVENTION

One of the main goals of near-field scanning microwave microscopy is to quantitatively measure a material's complex microwave permittivity (dielectric constant and conductivity) with a high sensitivity of lateral and/or depth selectivity (i.e. to determine the material's property over a small volume while ignoring the contribution of that volume's surrounding environment). This is particularly important in measurements on complex structures, such as semiconductor devices or composite materials, where, for example, the permittivity of one line or layer must be determined without having knowledge of the properties of the neighboring lines or underlying layers.

In microwave microscopy a basic measurement is a determination of the reflection of a microwave signal from a probe positioned in close proximity to a sample. Phase and amplitude of the reflected signal may be determined directly by using a vector network analyzer or by determination of the resonant frequency and quality factor of a resonator coupled to the probe.

In many cases, the phase of the reflected signal correlates to a large extent with the real part of the sample permittivity, whereas magnitude is dominated by the imaginary part of the permittivity (i.e., the microwave absorption of the sample). Measurements of the microwave transmission from the probe through the sample are also possible, however, such an arrangement generally does not yield a localized determination of a sample's complex permittivity.

The most typical approaches in microwave microscopy employ a coaxial probe geometry also referred to as apertureless probes, in which a central inner conductor (usually an STM tip) protrudes from one end of the probe and is tapered, as shown in FIG. 1. An alternative to the rotationally-symmetric arrangement of the coaxial probes are planar structures such as a co-planar wave-guide or a strip-line wave-guide. The tapered tip is used for concentrating the electric field around and/or underneath the tip apex which permits the probes to 'image' features on the order of the tip apex curvature or less. This 'imaging' resolution, however, is not a quantitative measurement since the probe is averaging over a volume that is usually a few orders of magnitude larger (usually a few millimeters) than the tip apex curvature. While the field concentration around the tip apex is significant, there are also fields that extend over much larger distances. Such an apparatus yields an imaging resolution on the order of the diameter or radius of curvature of the central conductor tip.

It is obvious from considerations of classic electrodynamics that the volume of space over which an apparatus determines the electrical properties of a sample is determined not by the local dimensions of the central conductor tip alone, but rather by a length scale given by the separation between the central conductor tip and the ground (outer) conductor or shield, as shown in FIG. 1.

Therefore, in order to quantitatively determine the microwave properties of a material these properties must be devoid of non-uniformities on length scales of at least several times larger than the distance between the probe tip and the ground conductor while sufficient imaging contrast on length scales comparable to the radius of curvature of the tip may be achieved.

It is further obvious from considerations of classical electrodynamics that the separation between the probe and a sample affects the capacitance measured which is a function of the probe-sample separation and the electrical field distribution. Thus, it is important that the separation between the probe and the sample be measured in order to determine complex permittivity in a non-contact manner. Without accurate control of distance and a small volume of electrical field distribution, high lateral and/or depth selectivity and accurate quantitative results cannot be achieved with conventional technology.

Furthermore, the inherent unbalanced character of the exposed portion of the probe complicates the above-mentioned geometries due to the dipole-like current-flow in the surrounding area. The amount of radiation is critically dependent on the environment, i.e., the sample's complex permittivity and the probe-to-sample distance which affects the amplitude of the reflected signal (reflection measurement) or quality factor of the resonator (resonant technique). The result is a potentially erroneous determination of the sample's microwave absorption.

Conventional near-field microwave probes cannot be used for simultaneous near-field optical measurements and complex permittivity measurements due to the fact that the tapered fiber tip serves as a circular waveguide disadvantageously having a cut-off frequency for the optical and microwave radiation.

SUMMARY OF THE INVENTION

An object of the present invention is to provide a novel probe for the nondestructive determination of a sample's complex permittivity based on a balanced multi-conductor transmission line resonator which is symmetric with respect to an exchange of signal between the conductors. This permits confinement of the probing field within the desired sampling volume to significantly reduce dependency of measurements on the sample volume's environment.

It is another object of the present invention to provide a method for fabrication of a dielectric support member based (including a fiber-optic based) near-field microwave probe by means of coating an elongated dielectric support member with a conducting material which is further processed in subsequent technological steps to be removed from a predetermined number of sides of the dielectric support member resulting in the dielectric support member coated with a multi-conductor transmission line which can be used as a probe for complex permittivity measurements as well as providing a tip for near field optical microscopy.

In accordance with the principles herein presented, the present invention provides a novel probe for non-destructive measurements which includes a multi-conductor (preferably, a two-conductor) transmission line created on the dielectric support member. One end of the transmission line (also referred to herein as the "probing end") is brought into close proximity to the sample to be measured and may be tapered (or sharpened) to an end having a minimal spatial extent. A signal is fed through the transmission line toward the sample and a signal reflected from the sample is measured. The opposite end of the transmission line is connected to electronics for the determination of the reflected signal's phase and magnitude. Measurements of the phase and magnitude of the reflected signal are broadband in frequency. Alternatively, if the probe is coupled to a resonator, the electronics then determine the resonant frequency and quality factor of the resonator which results in a measurement which is narrowband in frequency.

In this type of system, the diameter of the tip portion of the probe is in the range from 50 nm to 10 $\mu$m, with the diameter of the elongated dielectric support member being in the range from 10 $\mu$m to 10 mm. The conductive strips are separated one from the other around the dielectric support member by a distance not to exceed approximately 100 nm.

Each conductive strip is formed from a conductive material from a group which includes: metallic or superconducting materials, Au, Ag, Cu, Al, YBCO, Cr, W, Pt, Nb, etc., and mixtures thereof. Each conductive strip is formed upon a Cr, Ni, W, or Ta underlayer of 50–100 Å thickness directly deposited on the dielectric support member (or onto a cladding layer if the dielectric support member is fiber-optic based structure).

In accordance with the subject invention concept, such a dielectric support may be in the form of any of the following embodiments:

a) Optical fiber with exposed cladding, having bare (untapered) cladding diameter in the range of 10 $\mu$m to 10 mm. The fiber may be formed from any insulating material that can be tapered by means of etching and/or heating/pulling, and has a dielectric loss tangent $\leq 10^{-1}$ at the operating frequency (e.g. quartz, sapphire, glass, etc.)

b) Dielectric rod (substantially circular in cross-section) from 10 $\mu$m to 10 mm in outer diameter formed from any insulating material that may be tapered by means of etching and/or heating/pulling and has a dielectric loss tangent $\leq 10^{-1}$ at the operating frequency (e.g. quartz, sapphire, glass, etc.)

c) Dielectric tube (micropipette, etc.) from 10 $\mu$m to 10 mm in outer diameter and appropriate inner diameter formed from any insulating material that can be tapered by means of etching and/or heating/pulling and has a dielectric loss tangent $\leq 10^{-1}$ at the operating frequency (e.g. quartz, sapphire, glass, etc.)

d) Dielectric tube (micropipette, etc.) from 10 $\mu$m to 10 mm in outer diameter and appropriate inner diameter formed from any insulating material that may be tapered by means of etching and/or heating/pulling, and has a dielectric loss tangent $\leq 10^{-1}$ at the operating frequency (e.g. quartz, sapphire, glass, etc.) with an optical fiber inserted into the tube.

e) Dielectric bar of square, rectangular, pentagonal, hexagonal, octagonal, etc. cross-section with the cross-section linear dimensions from 10 $\mu$m to 10 mm formed from any insulating material that may be tapered by means of etching and/or heating/pulling and has a dielectric loss tangent $\leq 10^{-1}$ at the operating frequency (e.g. quartz, sapphire, glass, etc.)

f) Multi-barrel dielectric tubing (with the number of barrels from 2 to 20) or Theta-tube formed from any insulator that may be tapered by means of etching and/or heating/pulling and which has a dielectric loss tangent $\leq 10^{-1}$ at the operating frequency (e.g. quartz, sapphire, glass, etc.). One or more of the barrels may have an inserted optical fiber or metal wire.

The present invention is further directed to a method for manufacturing dielectric support member based probes, including fiber-based probes for near-field optical microscopy and/or complex permittivity measurements. For manufacturing the fiber-based probes, the method includes a preliminary step of:

removing an outer jacket from a fiber-optic wire of a predetermined length to expose a cladding layer surrounding a central optical fiber of the fiber-optic wire and anisotropically depositing a 50–100 Å thick underlayer of Cr, Ni, W or Ta onto the cladding layer. For all other dielectric support member based probes, a 50–100 Å thick under layer of Cr, Ni, W or Ta is anisotropically deposited directly onto the dielectric support member.

The method further includes:

optionally removing the Cr, Ni, W or Ta underlayer between predetermined locations;

anisotropically depositing a conductive material on the Cr, Ni, W or Ta underlayer at predetermined locations; and removing the conductive material between the predetermined locations, to form a plurality of electrically isolated conductive strips on the elongated dielectric support member (including fiber optic wire).

The conductive material and the Cr, Ni, W or Ta underlayer are deposited by one of any known conventional deposition techniques, for example, Pulsed Energy Deposition, Evaporation, Sputtering, Dipping, Focused Ion Beam Deposition, etc.

The conductive material and the Cr, Ni, W or Ta underlayer are removed by means of a number of material removal techniques, such as: Ion Beam Milling, Focused Ion Beam Milling, Chemical Etching, Mask-Less Photo-Lithography, etc.

The removal of the Cr, Ni, W or Ta underlayer may be omitted since it has been found that the method works with or without this step being incorporated.

For all of the aforesaid embodiments of the probe 10 of the present invention the procedure for fabrication of the probes is substantially the same and includes the following steps:

(i) The elongated dielectric support member is tapered down by means of chemical etching (e.g. using HF, etc.) and/or heating/pulling (e.g. using $CO_2$ laser or heating filament based puller) thus forming a tip at the end with the apex curvature (or diameter) down to 10 nm;

(ii) The tapered dielectric support member is coated with a conducting material (e.g. Cu, Al, Ag, Au, etc.). Multi-layer coating may be used (e.g. Cr/Au) in this step.

(iii) The conducting material is removed from two or more sides to produce a multi-conductor transmission line that may be used as a probe for complex permittivity measurements.

For the embodiment (f), the procedure for manufacturing of the probe may include the following procedures:

(i) Two (or more) metallic wires (e.g. Cu, Al, Ag, Au, etc.) of appropriate diameter are inserted into the two (or more) different openings inside the multi-barrel or the capillary Theta-tube made of quartz;

(ii) The assembly obtained in (i) is tapered by means of heating/pulling (e.g. using $CO_2$ laser or heating filament based puller) thus forming a tip with the apex curvature (or diameter) down to 10 nm;

(iii) Optionally a tapered structure is uniformly coated with a conducting material (e.g. Cu, Al, Ag, Au, etc.) forming a shielded balanced transmission line. Additionally, a multi-layer coating may be used (e.g. Cr/Au). Such a structure permits construction of a balanced microwave transmission line and/or a resonator due to generally low microwave losses in quartz.

These and other novel features and advantages of this invention will be fully understood from the following detailed description of the accompanying Drawings.

BRIEF DESCRIPTION OF THE DRAWINGS

FIGS. 4A–4G is a schematic representation of a technological sequence of fabrication of the dielectric support member based probe of the present invention;

FIGS. 5A–5D is a schematic representation of the maskless photolithography technique of the present invention;

FIGS. 6A–6B represent schematically the technique for manufacturing the probes in the form of multi-barrel dielectric tubing;

FIGS. 7A–7B is a schematic representation of the focused ion beam (FIB) cut technique for making the tip of the dielectric support member based near-field probe;

FIGS. 8A–8C is a schematic representation of the ion milling technique for fabricating the tip of the probe of the present invention;

FIGS. 9A–9C is a schematic representation of the FIB erasing technique for fabricating the tip of the probe of the present invention; and FIGS. 10A–10B is a schematic representation of the FIB technique for drawing strip lines onto the tip of the probe of the present invention.

DETAILED DESCRIPTION OF THE PREFERRED EMBODIMENT

Figure 1:
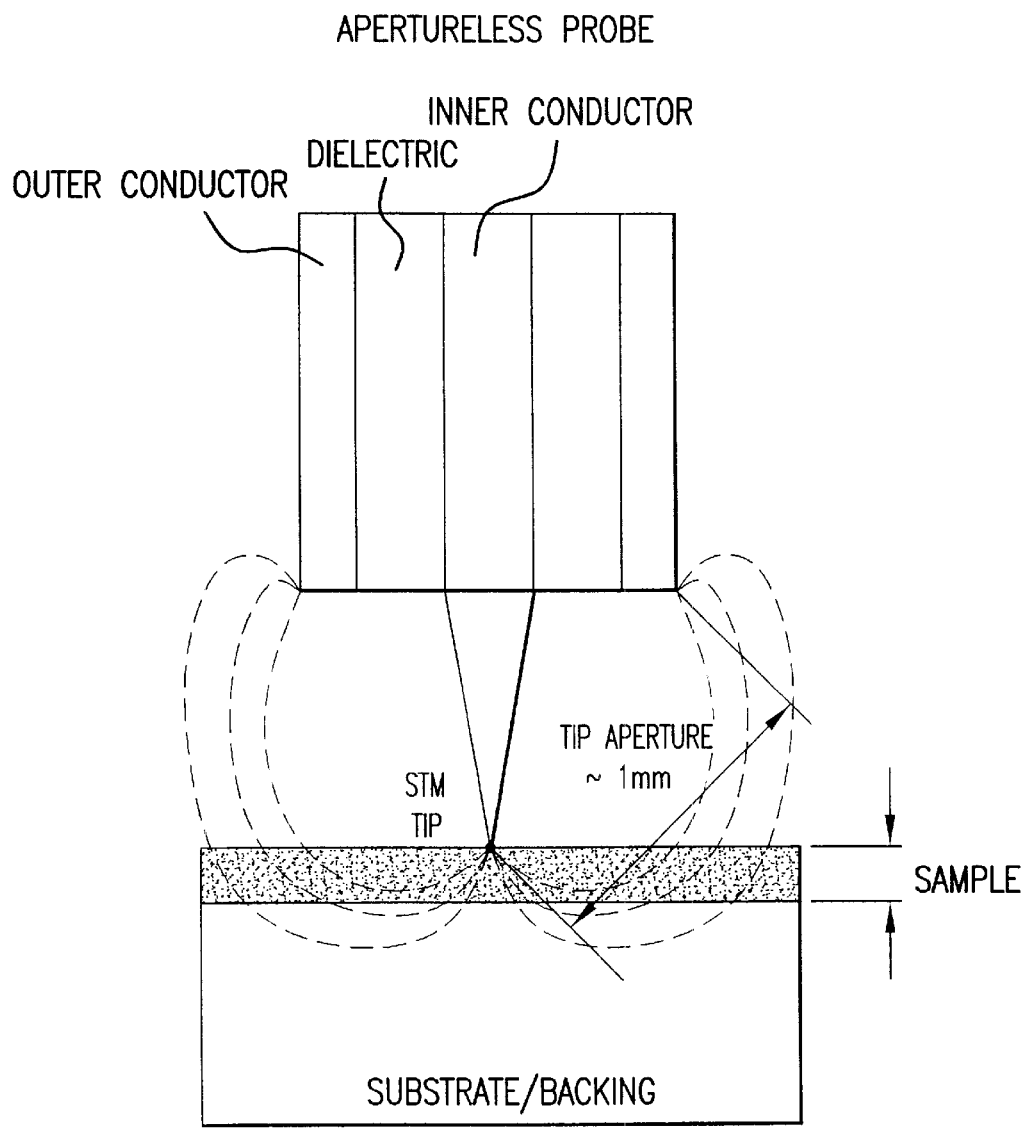
FIG. 1 is a schematic representation of an apertureless probe of a prior art system.
Figure 2:
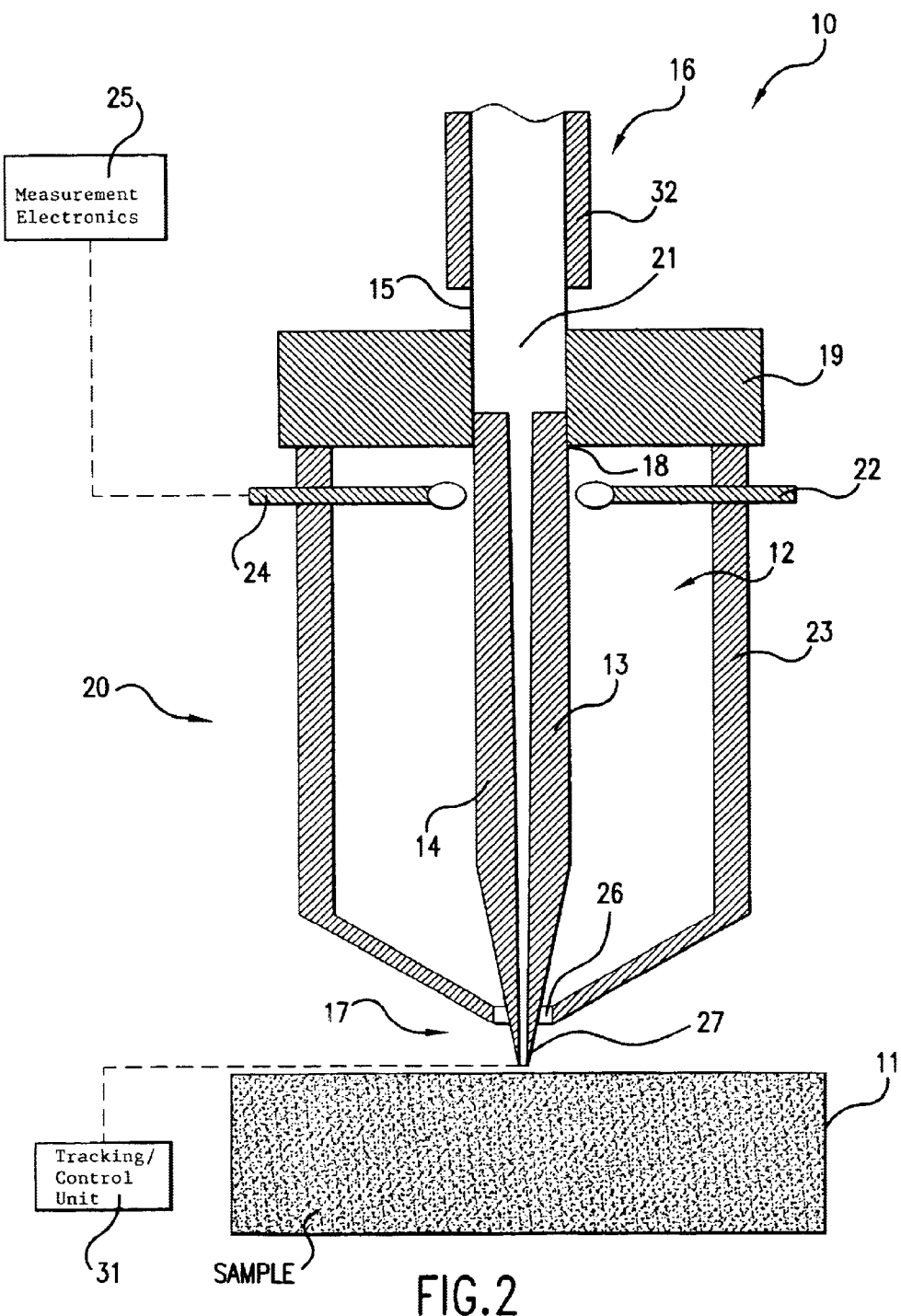
FIG. 2 schematically depicts a resonator formed by a dielectric support member based probe of the present invention having a tapered wire with a pair of metallic strips deposited thereon.
Figure 3:
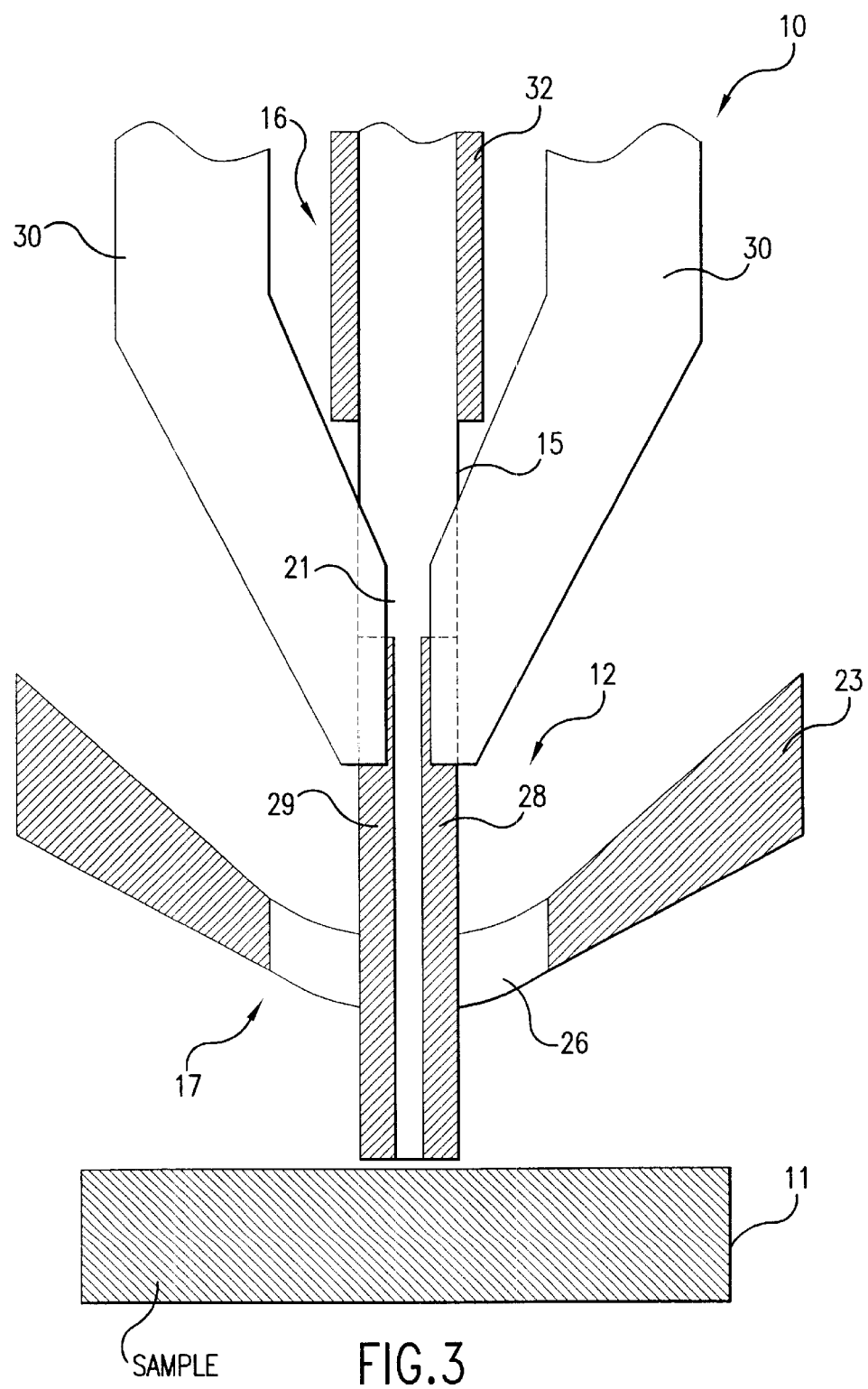
FIG. 3 schematically describes a probe of the present invention formed by an untapered dielectric support member with two conductive strips deposited thereon.

Referring to FIGS. 2–3, there is shown a probe 10 for non-destructive determination of the complex permittivity of a sample 11. The probe 10 is designed as a dielectric support member based two conductor transmission line 12. The support member for the probe 10 is formed of dielectric (i.e., insulating) material that is elongated along one axis, and may have varying dimensions of its cross-section along the length thereof The probe 10 includes two (or more) spatially separated symmetrically arranged electrical conductors (conductive strips) 13 and 14 deposited on a surface thereof or extending internally along the length of the dielectric support.

The dielectric support member may be in the form of any of the following embodiments:

a) Optical fiber with exposed cladding, with bare (untapered) cladding diameter in the range of 10 $\mu$m to 10 mm. The fiber may be formed from an insulating material that can be tapered by means of etching and/or heating/pulling and has a dielectric loss tangent $\leq 10^{-1}$ at the operating frequency (e.g. quartz, sapphire, glass, etc.)

b) Dielectric rod (circular in cross-section thereof) from approximately 10 $\mu$m to 10 mm in outer diameter formed from an insulating material that can be tapered by means of etching and/or heating/pulling and has a dielectric loss tangent $\leq 10^{-1}$ at the operating frequency (e.g. quartz, sapphire, glass, etc.)

c) Dielectric tube (micropipette, etc.) from 10 $\mu$m to 10 mm in outer diameter and appropriate inner diameter formed from an insulating material that can be tapered by means of etching and/or heating/pulling, and has a dielectric loss tangent $\leq 10^{-1}$ at the operating frequency (e.g. quartz, sapphire, glass, etc.)

d) Dielectric tube (micropipette, etc.) from 10 $\mu$m to 10 mm in outer diameter and appropriate inner diameter formed from an insulating material that can be tapered by means of etching and/or heating/pulling, and has a dielectric loss tangent $\leq 10^{-1}$ at the operating frequency (e.g. quartz, sapphire, glass, etc.) with an optical fiber inserted into the tube.

e) Dielectric bar of square, rectangular, pentagonal, hexagonal, octagonal, etc. cross-section with the cross-section linear dimensions from 10 $\mu$m to 10 mm formed from an insulating material that can be tapered by means of etching and/or heating/pulling and has a dielectric loss tangent $\leq 10^{-1}$ at the operating frequency (e.g. quartz, sapphire, glass, etc.)

(f) Multi-barrel dielectric tubing (with the number of barrels from 2 to 20) or Theta-tube formed from an insulator that can be tapered by means of etching and/or heating/pulling and which has a dielectric loss tangent $\leq 10^{-1}$ at the operating frequency (e.g. quartz, sapphire, glass, etc.) With regard to the multi-barrel dielectric tubing, one or more of the barrels may have an inserted optical fiber or metal wire.

With regard to the fiber-optic-based embodiment of the probe 10 of the present invention specifically shown in FIGS. 2–3, the two (or more) spatially separated symmetrically arranged electrical conductors (also referred to herein as conductive elements) 13 and 14 are deposited on a surface of the cladding layer 15 of a fiber-optic wire 16. For all other embodiments referenced above, the conductive strips (or conductive elements) 13 and 14 are formed directly on the surface of the dielectric support member.

For the aforesaid embodiments of the probe 10 of the present invention, the procedure for manufacturing of the probes is substantially the same; and includes the following steps:

(i) The dielectric support member is tapered down by means of chemical etching (e.g. using HF, etc.) and/or heating/pulling (e.g. using $CO_2$ laser or heating filament based puller) thus forming a tip at the end with the apex curvature (or diameter) down to 10 nm;

(ii) The tapered dielectric support member is coated with a conducting material (e.g. Cu, Al, Ag, Au, etc.). Multi-layer coatings can be used (e.g. Cr/Au) in the overall coating step.

(iii) The conducting material is then removed from two or more sides to produce a multi-conductor transmission line which is used as a probe for complex permittivity measurements.

For the embodiment (f), the procedure for manufacturing of the probe may include the following procedures:

(i) Two (or more) metallic wires (e.g. Cu, Al, Ag, Au, etc.) of appropriate diameter are inserted into the two (or more) different openings inside the multi-barrel or the capillary theta-tube formed of quartz;

(ii) The assembly obtained in i) is tapered by means of heating/pulling (e.g. using $CO_2$ laser or heating filament based puller) thus forming a tip with the apex curvature (or diameter) having a dimension as low as 10 nm;

(iii) Optionally, such a tapered structure is uniformly coated with a conducting material (e.g. Cu, Al, Ag, Au, etc.), thus forming a shielded balanced transmission line. As previously noted, multi-layer coatings can be used (e.g. Cr/Au). Such a structure permits construction of a balanced microwave transmission line and/or a resonator due to low microwave losses in quartz.

As shown in FIGS. 6A–6B, the probe 10 is made from a Theta tube (or multi-barrel dielectric tubing) 60 having two or more channels 62 (the tube 60 is made of a material having a dielectric loss tangent $<10^{-3}$ at the operating frequency).

In each of the channels 62, a metal wire (or a fiber-optic wire) 64 with a thickness of about few hundred microns is inserted. The assembly thus formed is tapered down initially to approximately 10 nm by means of etching and/or heating/pulling (using for example CO2 lasers or heating filament based puller) thus forming a probe 10 having a tip 66 with the diameter 67 down to 10 nm, a diameter at the end 70 thereof approximately 1 mm, and the length 72 corresponding to $\lambda/4$ or $\lambda/2$ resonator.

The sheath 68 is further deposited onto the quartz tube 60 as shown in FIG. 6B, leaving the tip 66 free of the sheath. However, the sheath may be optionally extended down to the apex, as shown in interrupted lines in FIG. 6A, in order that the measurements with approximately the same spatial resolution can be made with this probe in both modes, such as co-axial and two-conductor probe geometries. The sheath 68 is preferably formed of Cu, Al, Ag, Au, or alternatively a multilayer coating can be used, for example, containing Cr/Au.

When used for manufacturing a resonator, the Q factor of such resonator with the probe shown in FIGS. 6A–6B may be a few hundred.

There are several techniques that have been developed for fabricating the tip for the dielectric support member based near field probe. For example, as shown in FIG. 7A, the focused ion beam (FIB) 82 is directed to the apex 84 of the tip of the tapered dielectric support member 21 covered by a metal 85 which may be Au. Such a technique produces a clean cut exposing a dielectric support member 21 surrounded by a plurality of electrically isolated conductive strips as shown in FIG. 7B illustrating a cross-section of the tip of the probe. As understood, the tip may be circular, rectangular, pentagonal, hexagonal, octagonal, etc., or otherwise contoured.

As shown in FIGS. 8A–8C, ion milling can be used for fabricating the tip of a near field probe. As shown in FIG. 8A, an ion beam 86 is directed to the apex 84 of the probe, i.e., the dielectric support member 21 covered with the conductive material 88, and the probe is rotated in the direction shown by the arrow 90. Also, as shown in FIG. 8B, the dielectric wire 21 may be bounced around the tip point as shown by the arrow 92 in order to permit the ion beam 86 to etch the gap 94 with the width on the order of the tip curvature, as shown in FIG. 8C. This technique is relatively inexpensive, simple, and can be done in-situ.

Shown in FIGS. 9A–9C is another technique of fabricating the tips of the probes of the present invention, i.e., FIB erasing. According to this technique, the Au (Ag, Al, etc.) is deposited onto the dielectric support member 21 and ion milling is performed which is applied to the apex of the probe, similar to the procedure shown in FIGS. 8A and 8B, or using FIB 82 to make a channel in the tip. The diameter of the channel may be approximately 5 nm. The tip is then cut off with FIB 82 as shown in FIG. 9B, or the FIB 82 can be scanned around the tip, as shown in FIG. 9C.

As shown in FIGS. 10A and 10B, the FIB may also be used to draw strip lines on the dielectric support member. In this manner, the focused ion beam 96 is directed towards the tip of the probe (dielectric material of the dielectric wire 21 is exposed from the metal cover 88), and is reciprocally moved in the direction shown by the arrow 98 so that particulates of a conductive material are deposited onto the tip of the probe to form a narrow line 100 with the thickness of the line being approximately 5 nm.

The embodiments (a), (d), and (f) of the probe of the present invention that include an optical fiber in addition to complex permittivity measurements may also be used for performing simultaneous near-field optical microscopy measurements. Additionally, embodiments (c) and (f) may be used to measure the permittivity of very small amounts of liquid by means of pulling the liquid into the capillary tube.

Referring again to FIGS. 2 and 3, to conduct measurements, a probing end 17 of the transmission line 12 is brought in close proximity to the sample 11, while an opposite end 18 of the transmission line 12 is either connected to electronics for the determination of a reflected signal's phase and magnitude, or to a terminating plate 19 to form a resonator structure 20 for purposes described in following paragraphs.

The probe 10 is primarily envisioned in two functional embodiments:

A. In operation as a transmission line for feeding a signal to the sample 11 and measuring the phase as well as the magnitude of the reflected signal. This transmission line is operated either in the odd mode, i.e., in a mode in which the current flow in one of the two conductors for example, the conductor 13, is opposite in direction to that in the other conductor 14; or, in an even mode where a conducting sheath is used for enveloping the transmission line 12. When operated in the even mode, the interaction between the sample and the probe is similar to the coaxial symmetries known to those skilled in the art. Measurements of the phase and magnitude of the reflected signal by means of the transmission line arrangement are broadband in frequency but are generally not satisfactory with respect to sensitivity to the sample properties and require additional rather expensive and complex electronic equipment to be used such as a vector network analyzer.

B. In order to obtain a more sensitive and accurate result while employing less expensive equipment, the probe 10 of the present invention is envisioned as a resonator structure 20 which is formed by a portion of the transmission line 12 with the conductors 13, 14 separated by a dielectric medium of the dielectric support member 21 shown in FIG. 2.

The probing end 17 of the resonator structure 20 is brought into proximity to the sample 11 (which may be an ion-implanted silicon, metal and/or dielectric complex structure, metal and/or dielectric films on any substrate, etc.) with the opposite end 18 of the transmission line resonator structure 20 being coupled to the terminating plate 19. The resonator structure 20 is formed in order to measure the resonant frequency and quality factor of the resonator structure 20 for determination of the complex permittivity of the sample 11.

The spacing between the conductors 13, 14, and their cross-section have to be properly chosen in order to maintain a resonator quality factor Q high enough for accurate measurements of the sample induced changes in the resonant frequency and the Q factor. The distance between the conductors 13 and 14 has to be on the order of or greater than approximately 1 mm for Q>1000 at 10 GHz. This distance is determined by the diameter of the dielectric support member which may be in the range from 10 $\mu$m to 10 mm.

When the probe 10 of the present invention is operated as the resonator, the odd and even modes of operation in general result in two different resonant frequencies due to dispersion of the signal and may therefore be separated in the frequency domain and independently powered and monitored. The dielectric medium of the support member 21 between the conductors 13 and 14 serves to enhance such dispersion.

The coupling to the resonator 20 is accomplished by a coupling loop 22 positioned close to the resonator 20 inside an optional conducting sheath 23 (as best shown in FIG. 2). An optional second coupling loop 24 may be used for the measurement electronics 25, schematically shown in FIG. 2. Alternatively, a circulator or directional coupler may be used to separate the signal reflected from the resonator 20 back into the feed loop.

The resonant frequency and quality factor of the resonator structure 20 may be determined by techniques known to those skilled in the art. One commonly used configuration is shown in D. E. Steinhauer, C. P. Vlahacos, S. K. Dutta, F. C. Wellstood, and S. M. Anlage, *Applied Physics Letters*, Volume 71, Number 12, Sep. 22, 1997, pages 1736–1738.

In particular, a frequency-modulated microwave signal (typically at 5–10 GHz, 1 mW) is generated by a microwave source, such as the model HP83752A manufactured by Agilent Technologies (Palo Alto, Calif.), which is fed to the resonator. The reflected signal is routed via a circulator, such as model DMC6018 from DiTom (San Jose, Calif.) to a detector diode, such as model HP8473C from Agilent Technologies (Palo Alto, Calif.). The output of the diode is a voltage signal having a component at a frequency identical to that of the frequency modulation of the microwave source which can be accurately detected using a lock-in amplifier, such as model 7280 from Ametek, Inc. (Oak Ridge, Tenn.).

The voltage measured using the lock-in amplifier is proportional to the difference between the resonance frequency and the carrier frequency of the microwave source. A voltage component at twice the frequency of the modulation of the microwave signal is proportional to the quality factor of the resonator. This may again be measured using a lock-in amplifier, such as model 7280 from Ametec, Inc. (Oak Ridge, Tenn.). The complex permittivity of the sample may be determined by comparison of the measured quantities to calibration data obtained for known materials.

The resonator structure 20 of the present invention forms either a $(2n+1)\lambda/4$ or a $(n+1)\lambda/2$ resonator (n=0, 1, 2, . . . ), and its length is determined by the frequency of the lowest mode, e.g., about 7.5 mm for the $\lambda/4$ mode at 10 GHz.

The resonator structure 20 may be enclosed in a cylindrical sheath 23 as shown in FIG. 2, for example, metallic or superconducting materials, Cr, W, Pt, Nb, Cu. Au, Ag, Al, YBCO and mixtures thereof. The sheath 23 eliminates both radiation from the resonator 20 and the effect of environment interference on the resonator characteristics. In particular, the changing influence of moving parts in the proximity of the resonator 20 is eliminated. The sheath 23 has an opening 26 near the sample area. This permits an efficient coupling of the sample 11 to the resonator 20 and further permits the resonant frequency and Q factor to be dependent on the sample microwave permittivity. Where the spacing between the conductors 13 and 14 is small in comparison to the inner diameter of the sheath 23, the resonator properties are substantially unaffected by the sheath presence. The upper part of the sheath 23 makes electrical contact with the terminating plate 19. The bottom portion of the sheath 23 may have a conical shape in order to provide clear physical and visual access to the sampling area.

As discussed in previous paragraphs, the probing end 17 of the resonator structure 20 is brought into close proximity to the sample 11 for measurement purposes. The geometry of the cross-section at the probing end 17 determines the sampling volume, i.e., the spatial resolution both laterally and in depth. Due to the symmetry of the near-field electrical field distribution at the probing end 17, the probe 10 of the present invention permits a determination of the in-plane anisotropy of the complex permittivity of the sample 11. In particular, measurements (or entire scans) obtained with different probe orientations with respect to the sample 11 may be compared or subtracted each from the other for the anisotropy determination.

If the sheath 23 is used with the probe 10, the probing end 17 protrudes through and beyond the opening 26 formed in the sheath 23. Due to the fact that there is weak coupling between the sheath 23 and the resonator 20, the diameter of the opening 26 affects neither the field intensity at the probing end 17, nor the Q factor of the resonator 20 and further does not affect the sample's contribution to the resonator 20 behavior.

However, for optimum spatial selectivity (quantitative resolution), the diameter of the opening 26 is generally less than the length of the proximal portion 27 of the resonator 20 that extends beyond the sheath 23. This eliminates the interaction between the sample 11 and the weak near-field that is present in the immediate environment of the opening 26. Due to the quadrupole-like current distribution in the portion 27 of the resonator 20 outside the sheath 23, this portion of the resonator 20 as well as the opening area 26 produces a negligible amount of microwave far-field radiation. Additionally, substantially no microwave current is present on the exterior surface of the sheath 23, which has been confirmed by 3D numerical modeling. Hence, the probe 10 produces significantly less radiation than conventional coaxial geometries and mainly interacts with the sample 11 via the near-field contribution.

In order to obtain high spatial resolution, in other words, in order to reduce the size of the volume over which the microwave properties of a sample are determined, the diameter of the conductors 13 and 14 at the probing end 17, as well as their spacing 21 must be reduced in size to the least possible dimension which may be accomplished by tapering each of the two conductors 13 and 14 down to the desired cross-section while simultaneously gradually reducing their separation as shown in FIG. 2.

Although the entire transmission line resonator 20 may be formed from a single piece of a dielectric material elongated along one axis and forming a cylindrical dielectric support member (including optical fiber) with either a non-tapered or tapered probing end, as shown in FIG. 2 and described in previous paragraphs, it is also envisioned to be within the scope of the present invention that a portion of the transmission line closest to the sample 11 may be replaced with a dielectric support member 21 onto which two metallic strips 28 and 29 are deposited on opposite sides of the dielectric support member 21 as shown in FIG. 3.

The two metallic strips 28 and 29 may be deposited on the dielectric support member in a manner to form either parallel untapered metallic lines, or conductive strips tapered to a sharp point and simultaneously are gradually brought into close proximity to each other (as shown in FIG. 2). In the arrangement shown in FIG. 3, a clamp 30 supports the dielectric support member in a predetermined orientation with respect to the sample 11.

In the embodiments shown in FIGS. 2 and 3, the dielectric support member with two conducting metal strips is loaded into the resonator 20 either via the through holes formed in the terminating plate 19 at the top of the probe 10, or through the opening 26 in the sheath 23.

The distance between the probe 10 and the sample 11 is controlled by a tracking/control unit 31, schematically shown in FIG. 2. The tracking/control unit 31 may include one of a number of distance detection mechanisms known in the field of near field scanning optical microscopy.

One of the embodiments of the probe 10 of the present invention, specifically the optical fiber based probe is fabricated on the base of a standard optical fiber 16 which includes a central optical fiber 21 surrounded by the cladding 15 and further surrounded by an outer jacket 32, shown in FIG. 4A. The outer jacket 32 is stripped from the cladding 15 to expose the cladding 15, as shown in FIG. 4B. For non-fiber based embodiments of the probe 10 of the present invention the procedures shown in FIGS. 4A and 4B are omitted. All further steps shown in FIGS. 4C–4G for the optical fiber-based and non-fiber based probes are similar. In this regard, the dielectric support member may be further optionally tapered as shown in FIG. 4C using standard techniques such as:

1. A heat-pull technique in accordance with which a laser beam is focused on the dielectric elongated member while force is applied at both ends of the dielectric member to stretch it. As the dielectric member is stretched, it becomes smaller in diameter near the center, while generally maintaining its original diameter near the ends to which the stretching force is applied. Finally, the tapered wire is separated into two wires with tapered tips. For the purposes of the present invention these tips are formed with diameters down to 10 μm. The laser may also be replaced with a coiled heating element, with the same effect.
2. Chemical etching technique, in accordance with which an end of the dielectric support member is exposed to an etchant in a timed predetermined manner, for example, by immersing the to-be tapered end of the dielectric support member into the etchant solution and pulling the dielectric support member from the solution at a predetermined speed thus creating a tapered profile of the dielectric member end.

Once the dielectric support member of the desired probe geometry and length is obtained, it is placed in the deposition chamber 33 schematically shown in FIG. 4D, in order to anisotropically deposit Cr, Ni, W or Ta underlayer 34 at predetermined positions 35 and 36 along the dielectric member (or along the cladding 15 in the fiber-based embodiment). The underlayer 34 may be deposited by Pulsed Laser Deposition, Evaporation, Dipping, Sputtering, or Focused Ion Beam Deposition. In order to perform the deposition/evaporation technique, a source 37 of Cr, Ni, W or Ta is positioned a predetermined distance from the dielectric support member within the deposition chamber 33 and the particulates of Cr, Ni, W or Ta are directed from the source 37 to the side of the dielectric support member proximal to the source 37.

The source 37 of Cr, Ni, W or Ta may be either an evaporator boat for performing thermal evaporation, or a deposition plume which may be used in accordance with known techniques of pulse laser deposition. Additionally, the deposition of material directly onto the surface of the dielectric support member or onto the surface of the cladding 15 may be performed by conventional dipping techniques known to those skilled in the art. The deposition/evaporation technique provides for a directional deposit of Cr (or other) material onto the side of the dielectric member facing the source of material.

After the source facing side is coated, the dielectric support member is rotated according to the number of conductors desired to be deposited. As an example, a two conductor probe requires two depositions with 180° rotation. A three conductor probe will require three depositions with 120° rotation between them (the rotation angle is 360° divided by the number of conductors required). During deposition of Cr, Ni, W or Ta, sides 38 and 39 between the predetermined positions 35 and 36 (where the conductive strips are to be deposited) also receives some material, the thickness of which is significantly less than at the locations 35 and 36.

The result is that the thick layers 40 and 41 of Cr, Ni, W or Ta which are positioned at the predetermined locations 35 and 36 may be connected by a thin layer 42 and 43 of Cr, Ni, W or Ta present on the two "side walls" 38 and 39. These two thin layers 42 and 43 may be optionally removed in a following step, shown in FIG. 4E through ion beam milling, focused ion beam milling, or by chemical etching. However, the Cr, Ni, W or Ta underlayer may be left unremoved since it has been found that the presence of the Cr, Ni, W or Ta underlayer does not deteriorate the performance of the probe.

Etching solvents may also be used to remove conducting material from a specific area on a surface. In this case a photoresist may be applied to a sample and then selectively exposed to allow etching solvents to remove material only in the exposed area.

In one scenario, in order to remove the thin layers 42 and 43 of Cr, Ni, W or Ta and separate the two thick layers 40 and 41, both side walls 38 and 39 of the dielectric support member are exposed to an ion beam, which due to anistropy of the geometry, mills away only the material from the side walls 38, 39 and leaves the thick strips at the top and the bottom 35 and 36 substantially untouched. This results in a structure with a cross-section shown schematically in FIG. 4E.

After removal of the thin layer 42, 43 from the sides 38 and 39, thick layers 40 and 41 of Cr, Ni, W or Ta of the thickness approximately 50–100 Å are left on the sides 35 and 36 of the dielectric support member.

Further, in the following step shown in FIG. 4F, up to 10 μm thick conductive material which may include any metallic material or superconductor, Cr, W, Pt, Nb, Au, Ag, Cu, Al, YBCO, or mixtures thereof, is deposited on the thick layer of Cr, Ni, W or Ta 40 using the deposition/evaporation technique shown in FIG. 4D and described in previous paragraphs. The deposition/evaporation technique provides for a directional deposit of conductive material onto the thick layer of Cr, Ni, W or Ta 40 which facilitates adhesion of the conductive material to the surface of the dielectric support member.

After the layer 44 is deposited on the Cr, Ni, W or Ta underlayer 40, the structure is rotated in accordance with the number of conductors desired, and the deposition/evaporation technique is administered to the dielectric support member to deposit a conductive layer 45 on the top of the Cr, Ni, W or Ta underlayer 41. It is clear that a thin layer of conductive material can be deposited between the layers 44 and 45 which undesirably electrically couples the layers 44 and 45 of conductive material. In order to remove unwanted thin layers 46 and 47 of conductive material and to further electrically separate the layers of conductive material 44 and 45 each from the other, both thin layers 46 and 47 are exposed to an ion beam or focused ion beam which mills away the material from the positions between the layers of conductive material 44 and 45. Additionally, unwanted material may also be removed by chemical etching.

In this manner, the multi-strips structure may be created on the surface of a dielectric support member, which may include as many conductive strips as desired in accordance with the design of the probe. Although FIGS. 4A–4G illustrate a two conductor transmission line on the surface of the dielectric support member, it is clear that the principles of the present invention are equally applied to any number of conductors in the transmission line.

Two methods of removal of material from sides of the dielectric support member are envisioned in the scope of the present invention:

A. Ion beam milling which removes material from the side of the fiber wire which is facing the ion beam. Etch rates vary for different materials and milling apparatus, thus in order to mill the desired valley areas of the dielectric support member coating, the setting and duration of milling are controlled in accordance with the particular operation being performed.

A probe has been built, using the method described above, on a 125 μm fiber wire on a 1 mm diameter quartz rod, and on a 1×1.2 mm quartz bar. In each case, a 1 μm thick gold coating was deposited on the support member as described and then the gold was milled from the valleys with a 3 cm Commonwealth Scientific IBS 250 ion beam mill system for a duration of approximately 20 minutes on each side.

The etch rate was varied by changing the ion beam settings. The duration and etch rate determine the amount of material removed from the dielectric support member.

A smaller probe has been built, using the method of the present invention on a 125 μm tapered fiber wire, on a 1 mm tapered quartz rod, and on a 1×1.2 mm tapered quartz bar, all with a 12 μm diameter at the probing end of the fiber. A 1 μm thick gold coating on each wire was formed and the milling was performed of the gold from the valleys with a 3 cm Commonwealth Scientific IBS 250 ion beam mill system for a duration of approximately 45 minutes on each valley side. The result was a two-conductor transmission line with a separation of less than 12 μm and a volume resolution on the order of the transmission line separation.

B. As an alternative to ion beam milling, Mask-less photolithography has been developed by the Applicant to remove the conductive material and Cr, Ni, W or Ta underlayer (optionally) from the valleys. First, as shown in FIGS. 5A and 5B, a photo-resist 50 is applied onto the entire fiber wire coated with Cr, Ni, W or Ta. Light then is fed through the fiber wire, as shown in FIG. 5C, resulting in the exposure of the photo-resist 50 on the thin semitransparent sides 42 and 43 of the fiber wire. The photo-resist SO covering the thick portions 40 and 41 of the Cr, Ni, W or Ta underlayer is not affected due to the bulk of the Cr, Ni, W or Ta at these locations blocking the light. The fiber is then dipped in an etching solution 51 that removes the material from the exposed thin wall sides of the conductive coating, as shown in FIG. 5D.

The method shown in FIGS. 5A–5D with respect to removal of Cr, Ni, W or Ta underlayer is equally applicable to removal of the conductive material from the valleys 46 and 47 shown in FIG. 4F.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A dielectric support-based probe for complex permittivity measurements, comprising:
   a dielectric support member, and
   a multi-conductor transmission line comprising a plurality of electrically isolated conductive elements extending along the length of said dielectric support member, said plurality of electrically isolated conductive elements forming a tapered probe tip;
   an electrically conductive sheath mounted on said dielectric support member, said electrically conductive sheath receiving and enclosing said plurality of electrically isolated conductive elements to form a resonator cavity.

2. The dielectric support-based probe of claim 1, wherein the diameter of said tapered tip portion is in the range of 50 nm to 10 μm.

3. The dielectric support-based probe of claim 1, wherein said dielectric support member is a fiber optic member having a central optical fiber and a cladding layer surrounding said central optical fiber, said conductive elements including conductive strips extending on said cladding layer of said fiber optic member.

4. The dielectric support-based probe of claim 3, wherein said probe is further used for near-field scanning optical microscopy (NSOM) measurements.

5. The dielectric support-based probe of claim 1, wherein conductive elements include conductive strips, and wherein said multi-conductor transmission line includes a plurality of said conductive strips equidistantly spaced around said dielectric support member.

6. The dielectric support-based probe of claim 5, wherein said multi-conductor transmission line includes a pair of said conductive strips separated 180° from the other.

7. The dielectric support-based probe of claim 1, wherein the diameter of said dielectric support member is in the range of 10 μm to 10 mm.

8. The dielectric support-based probe of claim 1, wherein said conductive elements are separated one from the other by a distance of approximately 10 nm.

9. The dielectric support-based probe of claim 1, wherein said conductive elements are formed of a metallic material.

10. The dielectric support-based probe of claim 1, wherein said conductive elements are formed of a material selected from the group of materials consisting of: Au, Ag, Cu, Al, Cr, W, Pt, Nb, and YBCO, and mixtures thereof.

11. The dielectric support-based probe of claim 1, wherein each of said conductive elements includes a layer of a conductive material formed on a 50–100 Å thick underlayer of a material selected from the group of materials consisting of Cr, Ni, W or Ta formed on said dielectric support member.

12. The dielectric support-based probe of claim 1, wherein said conductive elements are formed of a superconducting material.

13. The dielectric support-based probe of claim 1, wherein said dielectric support member is made of a material selected from a group consisting of: quartz, sapphire, and glass.

14. The dielectric support-based probe of claim 1, wherein said dielectric support member is a dielectric rod.

15. The dielectric support-based probe of claim 14, wherein said dielectric support member has a cross-section thereof selected from the group of shapes, consisting of: circle, rectangle, pentagon, hexagon, and octagon.

16. The dielectric support-based probe of claim 1, wherein said dielectric support member is a single barrel dielectric tube.

17. The dielectric support-based probe of claim 16, further comprising an optical fiber inserted into at least one channel extending internally along said dielectric tube.

18. The dielectric support-based probe of claim 16, wherein said dielectric elements include metal wires, each inserted into at least one channel formed in said dielectric tube and extending along the length thereof.

19. The dielectric support-based probe of claim 1, wherein said dielectric support member is a multi-barrel dielectric tube.

* * * * *